United States Patent [19]

Bayerer

[11] Patent Number: 5,744,860

[45] Date of Patent: Apr. 28, 1998

[54] POWER SEMICONDUCTOR MODULE

[75] Inventor: Reinhold Bayerer, Reichelsheim, Germany

[73] Assignee: Asea Brown Boveri AG, Baden, Switzerland

[21] Appl. No.: 595,920

[22] Filed: Feb. 6, 1996

[51] Int. Cl.[6] .................................................. H01L 23/12
[52] U.S. Cl. .......................... 257/683; 257/704; 257/787
[58] Field of Search ................................. 257/683, 704, 257/787, 698

[56] References Cited

U.S. PATENT DOCUMENTS 5,473,191  12/1995  Tanaka .................................. 257/704

FOREIGN PATENT DOCUMENTS 2-33953   2/1990  Japan ................................. 257/683
6-169025  6/1994  Japan ................................. 257/704

*Primary Examiner*—Tom Thomas
*Assistant Examiner*—Roy Potter
*Attorney, Agent, or Firm*—Oblon, Spivak, McClelland, Maier & Neustadt, P.C.

[57] ABSTRACT

A power semiconductor module (201) is disclosed comprising at least one semiconductor chip, which is arranged on a baseplate (202) and is surrounded by a housing (204) arranged above the baseplate (202), and which can be externally connected by means of connecting lugs (205). The connecting lugs (205) are electrically connected to the at least one semiconductor chip and are routed to the outside through corresponding through-passage openings (210) in the housing (204). An explosion of the module in the event of a disturbance is reliably prevented or its effect is largely attenuated as a result of the fact that the connecting lugs (205) are constructed as parts of connection laminates (206), which are arranged inside the housing (204) and parallel to the baseplate (202) and are mechanically connected to the latter over a large area.

20 Claims, 6 Drawing Sheets

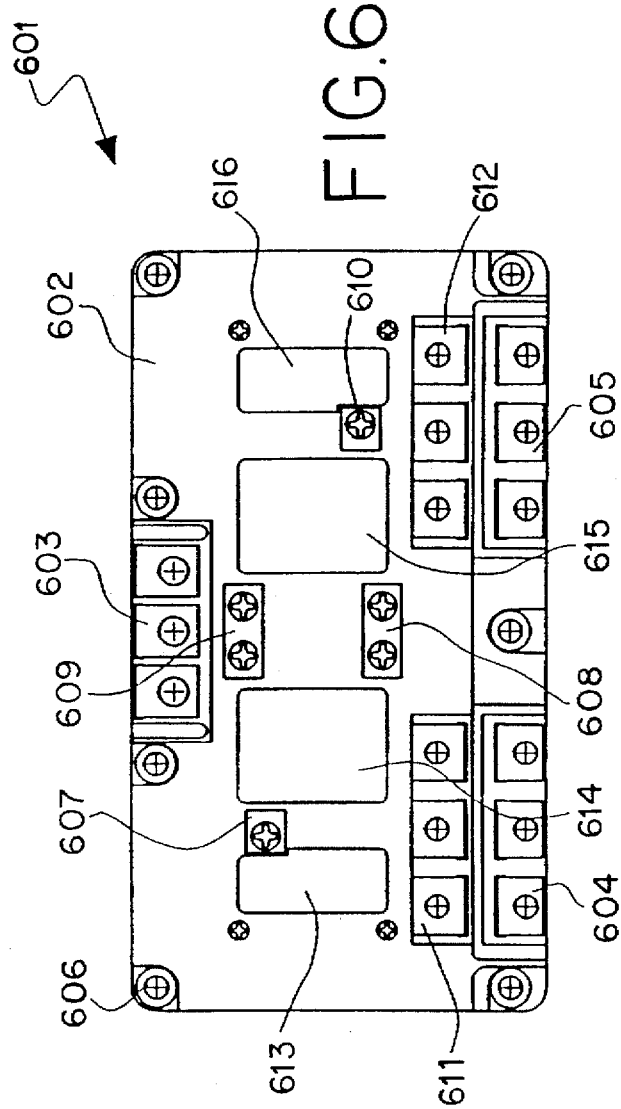
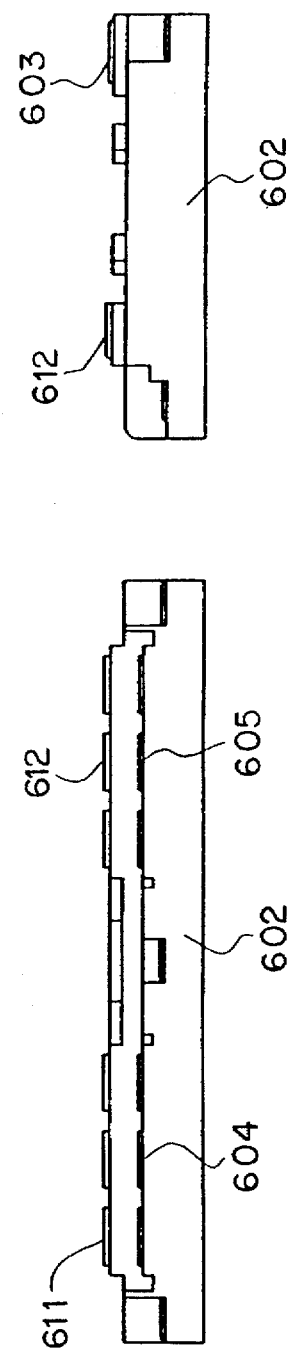
FIG.6a
FIG.6b
FIG.6c

5,744,860

POWER SEMICONDUCTOR MODULE

TECHNICAL FIELD

The present invention is concerned with the field of power electronics. It relates to a power semiconductor module, comprising at least one semiconductor chip, which is arranged on a baseplate and is surrounded by a housing arranged above the baseplate.

Such a power semiconductor module, as is also illustrated in FIG. 1, is disclosed in the prior art.

PRIOR ART

According to the prior art (FIG. 1), a power semiconductor module 101 is provided with two layers of different potting compound. The power semiconductor module 101 normally comprises a baseplate (made of Cu, Al or the like), on [lacuna] ceramic substrates 103 with semiconductor chips 106 are arranged. A housing 114 made of plastic is generally fitted onto the baseplate and serves as a frame for the potting of the module and as a carrier of the connections situated at the top (with the nuts 112, 113). The lower potting compound is a soft silicone gel 108 which serves to protect the semiconductor chips 106 and to protect the contact-making arrangement with the semiconductor surroundings (bonding wires 107; conductor tracks 104, 105 on the ceramic substrate 103; connecting lugs 110, 111). The upper potting compound is a curing epoxy resin 109. This potting closes off the module and imparts mechanical retention to the upwardly routed connections (connecting lugs 110, 111). This is the case, in particular, for the bent-over connections shown in FIG. 1, in the case of which the bending on the topside of the housing 114, does not take place until after the potting and the subsequent curing.

The first potting layer, the silicone gel 108, has a significantly higher (approximately fivefold) thermal expansion than the remaining component parts of the module. In the event of a disturbance, in particular an electrical short circuit, in the module, extreme temperatures can occur in the gel due to excessive currents. These abrupt temperature increases in the gel generally result in the explosion of the module. The rigid plastic walls of the housing 114 and the stopper-like layer of hard epoxy resin 108 [sic] initially provide for a high build-up of pressure in the gel, until a fracture occurs at the weakest point in the wall and the excess pressure discharges explosively.

In the course of such an explosion, not only is the module destroyed, but also considerable damage is caused in the circuitry surrounding the module. Thus, supply lines to the module, external capacitors, drive arrangements or the like may be damaged or destroyed, with the result that the total damage extends far beyond the unavoidable destruction of the module itself.

DESCRIPTION OF THE INVENTION

The object of the invention, then, is to construct a power semiconductor module in such a way that, with the mechanical stability remaining the same, an explosion of the module in the event of a disturbance can be reliably prevented or its effect can be attenuated to such an extent that no impairment to the surroundings of the module is to be expected.

In the case of a module of the type mentioned in the introduction, the object is achieved by virtue of the fact that the power semiconductor module is designed, above the at least one semiconductor chip, for reliable relief of an excess pressure which has formed in the region of the at least one semiconductor chip. By this means, a damaging increase in the internal pressure in the event of destruction it [sic] chips [sic] or the bonding wires leading thereto is avoided, and the pressure that is formed is dissipated to the outside using the shortest route.

A first preferred embodiment of the module according to the invention is distinguished by the fact that the at least one semiconductor chip can be externally connected by means of connecting lugs, which connecting lugs are electrically connected to the at least one semiconductor chip and are routed to the outside through corresponding through-passage openings in the housing, and in that the connecting lugs are constructed as parts of connection laminates, which connection laminates are arranged inside the housing and parallel to the baseplate and are mechanically connected to the latter over a large area. This ensures, without using a hard epoxy resin potting, that no mechanical loads are transmitted from the connecting lugs to the contact-making arrangement of the semiconductor chips and the position of the connections is fixed, so that the measures necessary for safe expansion of the gel in the event of a disturbance can easily be implemented. The connection laminates and the baseplate are preferably bonded together with insulating layers lying in between to form a layer composite.

A second preferred embodiment of the module according to the invention is distinguished by the fact that the connecting lugs are bent upward at the sides of the housing and are routed vertically out of the housing, and in that before the connecting lugs are bent, the housing is drawn right down onto the associated connection laminate and additionally supports the latter against vertically acting tensile forces. Forces acting vertically on the connecting lugs can additionally be absorbed by means of this measure.

In this case, the drawn-down housing can either rest directly on the respective connection laminate or alternatively, in order to accommodate manufacturing tolerances, can be drawn down to the respective connection laminate only to the extent that a gap remains free between the housing and the respective connection laminate, which gap is filled with a potting compound, for example a rubber-like silicone compound.

A third preferred embodiment is characterized in that, starting from the baseplate, the housing is filled at least partially with an insulating potting compound, and in that means are provided for preventing or rendering innocuous an explosive expansion of the potting compound in the event of a disturbance or short circuit.

In a first development of this embodiment, the means for preventing or rendering innocuous an explosive expansion of the potting compound comprise cavities which are arranged within the housing and into which the potting compound can expand unimpeded in the event of a disturbance or short circuit. By virtue of this expansion possibility, an excess pressure and hence an explosion are avoided and the mechanical protection of the semiconductor chips and of the other internal, mechanically sensitive parts is guaranteed by the predominantly closed plastic hood of the housing.

In a second, alternative development of this embodiment, the means for preventing or rendering innocuous an explosive expansion of the potting compound comprise desired breaking points which are arranged in the housing, rupture in the event of a disturbance or short circuit and enable the potting compound to emerge in an unimpeded manner. Simple potting with a gel which fills the entire housing is possible in this case. In addition, trapping means can be arranged above the housing, which trapping means intercept housing parts which are hurled away during the rupture of the desired breaking points. These trapping means can comprise, in particular, a drive unit for the module, which drive unit is fastened on the housing of the module.

In a third, alternative development of this embodiment, the means for preventing or rendering innocuous an explosive expansion of the potting compound comprise windows which are arranged in the housing and are closed off by an elastic potting compound, for example a rubber-like silicone compound. A build-up of pressure in the gel can largely be avoided due to the elasticity of the window closure. In the extreme case, the window closures can tear open in order to ensure the build-up [sic] of pressure in the gel without heavy housing parts being flung away.

A further embodiment of the invention is distinguished by the fact that the at least one semiconductor chip can be externally connected by means of connecting lugs, which connecting lugs are electrically connected to the at least one semiconductor chip and are routed to the outside through corresponding through-passage openings in the housing, and in that means are provided on the connecting lugs for securing the connecting lugs against being pulled out of the housing.

According to a preferred development of this embodiment, the securing means on the connecting lugs comprise laterally integrally formed tabs or laterally projecting shoulders, by means of which the connecting lugs can be supported on the inside of the housing.

Further embodiments emerge from the dependent claims.

BRIEF EXPLANATION OF THE FIGURES

The invention will be explained in more detail below using exemplary embodiments in conjunction with the drawing, in which

FIGS. 6a, 6b and 6c show a plan view, a front view and a side view respectively of an exemplary module according to FIG. 5, such as has already proved successful in practice.

WAYS OF EMBODYING THE INVENTION

Figure 2:
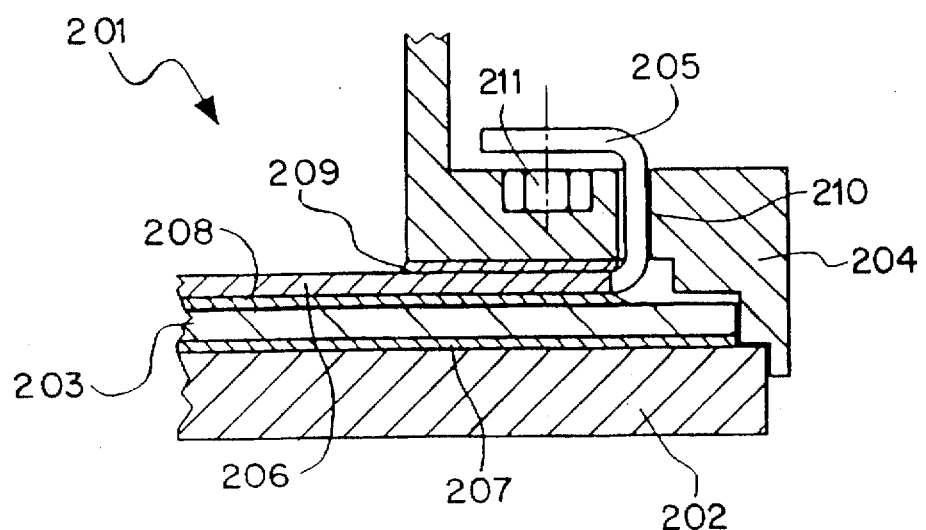
FIG. 2 shows a section of the edge region of a module structure according to a first preferred exemplary embodiment of the invention.

FIG. 2 represents a section of the edge region of a module structure according to a first preferred exemplary embodiment of the invention. The power semiconductor module 201 comprises a baseplate 202 (made of Cu, Al or the like). A layer structure made of insulating layers 203 bonded to the baseplate 202 and connection laminates 206 is provided for the connection of the semiconductor chips which are present in the module and not illustrated in the figure. The bonding takes place by means of adhesive layers 207, 208. For the sake of simplicity, only one connection laminate is illustrated in FIG. 2. As a rule, a plurality of connection laminates will be arranged one above the other and bonded with interposed insulating layers in order to be able to route the different connections of the chips (gates, collectors, emitters, auxiliary connections, etc.) to the outside in a mechanically stable and mutually insulating manner.

The connection laminates 206 which are bonded in a planar manner change into narrow connecting lugs 205 in the edge region of the module which are bent vertically upward and pass to the outside through the edge region of the housing 204. For this purpose, corresponding through-passage openings 210 are provided in the housing 204. The connecting lugs 205 are preferably bent once again through 90° outside the housing 204 and are passed over a nut 211 partially let into the housing 204, with the result that they can be connected by means of a screw connection. Since the connection laminates 206 are bonded to the baseplate 202, the connections are fastened on the baseplate 202 and thus obtain a vertical tensile strength. In addition, it is possible— as shown in FIG. 2—to configure the housing, which normally consists of a suitable plastic, in such a way that it is not only fitted on the baseplate 202 (outside the connection laminates), but also is drawn right down to the connection laminates in the region of the connection laminates, to be precise at the point where the connection lugs project upward.

In this case, the housing can either be seated directly on the connection laminates or—as can clearly be seen in FIG. 2—in order to accommodate manufacturing tolerances, can be drawn down to the respective connection laminate only to the extent that a thin gap remains free between the housing 204 and the respective connection laminate 206, which gap is filled with a potting compound 209, preferably a rubber-like silicone compound. In both versions, it is ensured that no mechanical loads are transmitted to the contact-making arrangement between the semiconductor chips and the connection laminates, and the vertical position of the connections is fixed.

Figure 3:
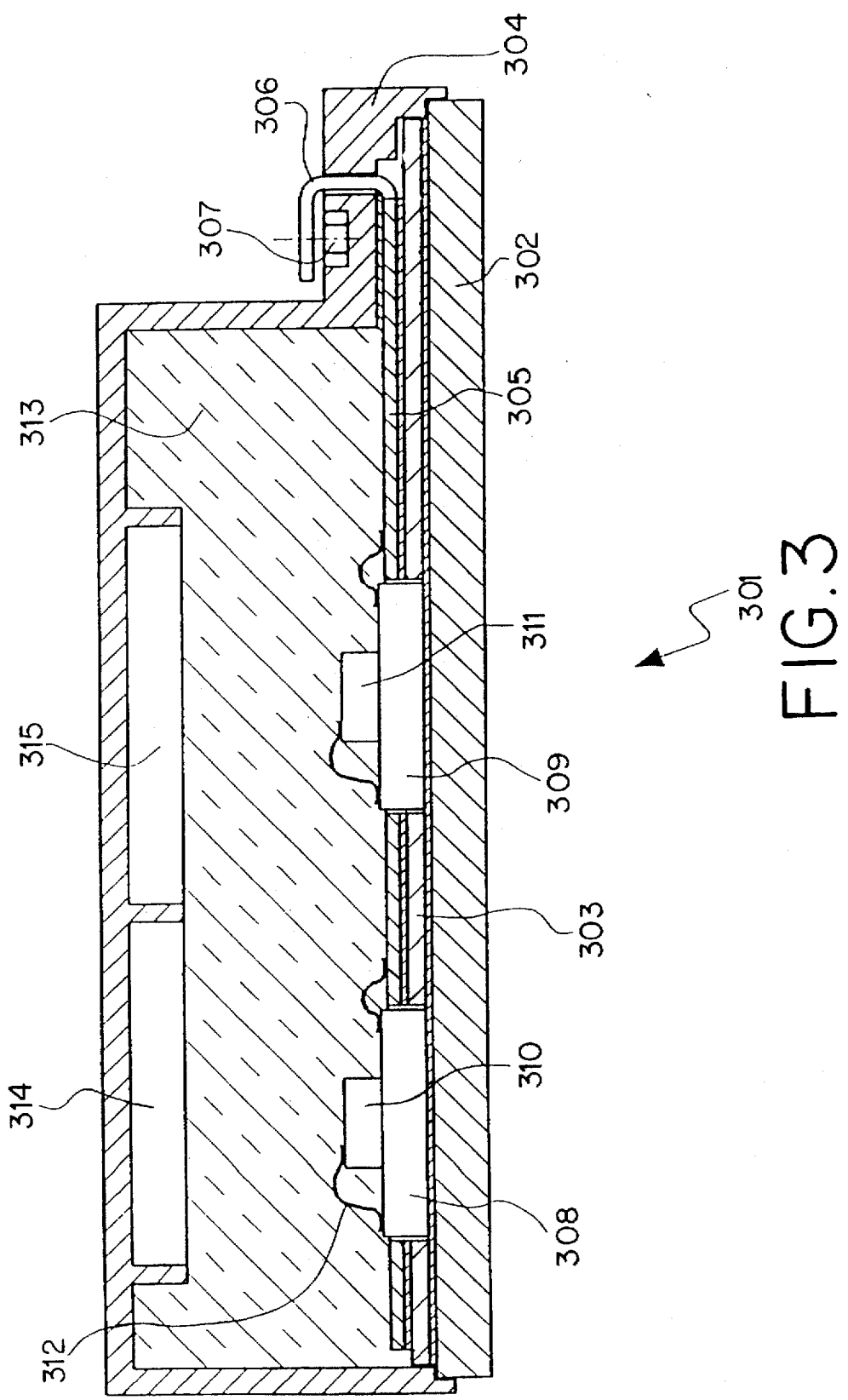
FIG. 3 shows a section of the complete structure of a module according to a second preferred exemplary embodiment of the invention with cavities for the expansion of the potting compound.

FIG. 3 represents a section of the complete structure of a module according to a second preferred exemplary embodiment of the invention. The power semiconductor module 301 again comprises a baseplate 302, on which are arranged a plurality of semiconductor chips 310, 311 on ceramic substrates 308, 309 as submodules. The semiconductor chips 310, 311 are electrically connected by means of bonding wires 312 to the layer structure made of connection laminates 305 and insulating layers 303, which are bonded together and to the baseplate 301 [sic]. The connection laminates 305 change at the side into connecting lugs 306, which—as already explained in connection with FIG. 2—are routed out of the housing 304 and bent over a nut 307 for connection purposes.

The hood-shaped module housing 304, which arches up over the submodules and is joined to the baseplate 302 at the edge side, is formed on its upper inner side in such a way that when the housing 304 is potted with the potting compound 313, a silicone gel, cavities 314, 315 form above the submodules or semiconductor chips 310, 311. In the event of an overcurrent, the gel can then expand freely into the cavities 314, 315 in the interior of the module, without the formation of an excess pressure. An explosion is thus avoided. At the same time, the mechanical protection of the semiconductor chips 310, 311 and of the other sensitive parts such as, for example, the bonding wires 312 during normal operation is fully ensured by the closed housing.

Figure 4:
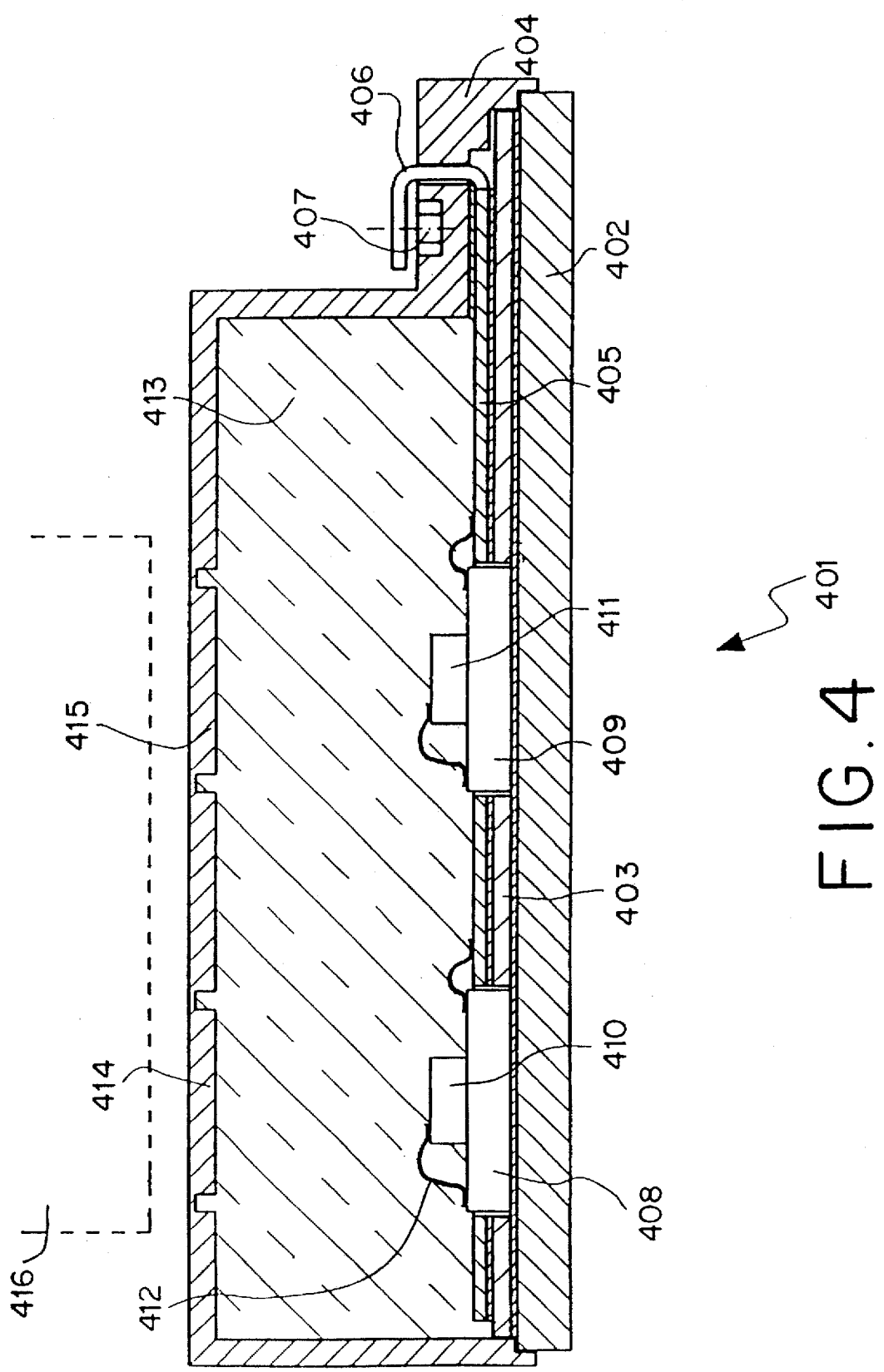
FIG. 4 shows a complete structure, comparable to FIG. 3, of a module according to a third preferred exemplary embodiment of the invention with desired breaking points in the housing for the expansion of the potting compound.

FIG. 4 shows a complete structure, comparable to FIG. 3, of a module according to a third preferred exemplary embodiment of the invention. In this case, too, the power semiconductor module 401 again comprises a baseplate 402, a plurality of submodules having a ceramic substrate 408 and 409 and a semiconductor chip 410 and 411, respectively, a bonded connection structure having connection laminates 405 and insulating layers 403, which is connected to the chips by means of bonding wires 412, as well as a hood-like housing 404 with the edge-side connection configuration formed by doubly bent connecting lugs 406 and nuts 407. In the case of this module 401, which is designed, for example, for voltages of 4500 V, no internal cavities like those in FIG. 3 exist following potting with the potting compound 413 (the gel). However, the top part of the housing has deliberately incorporated desired breaking points (weak points) 414, 415 above the submodules or semiconductor chips 410, 411, which desired breaking points rupture in the event of an excess pressure. A simple gel potting which fills the entire housing is consequently possible in this case. In order to prevent the housing parts being hurled away in the desire breaking region, it is possible to arrange above the housing 404 or the desired breaking points 414, 415 a drive unit 416 which is necessary in any case for the operation of the module, in such a way that it is at a distance of only a few mm, for example 4 mm, from the module and acts as a trap for the housing parts which break away. The drive unit must not be fastened directly on the module, in order reliably to permit pressure relief by means of expansion of the gel.

Figure 5:
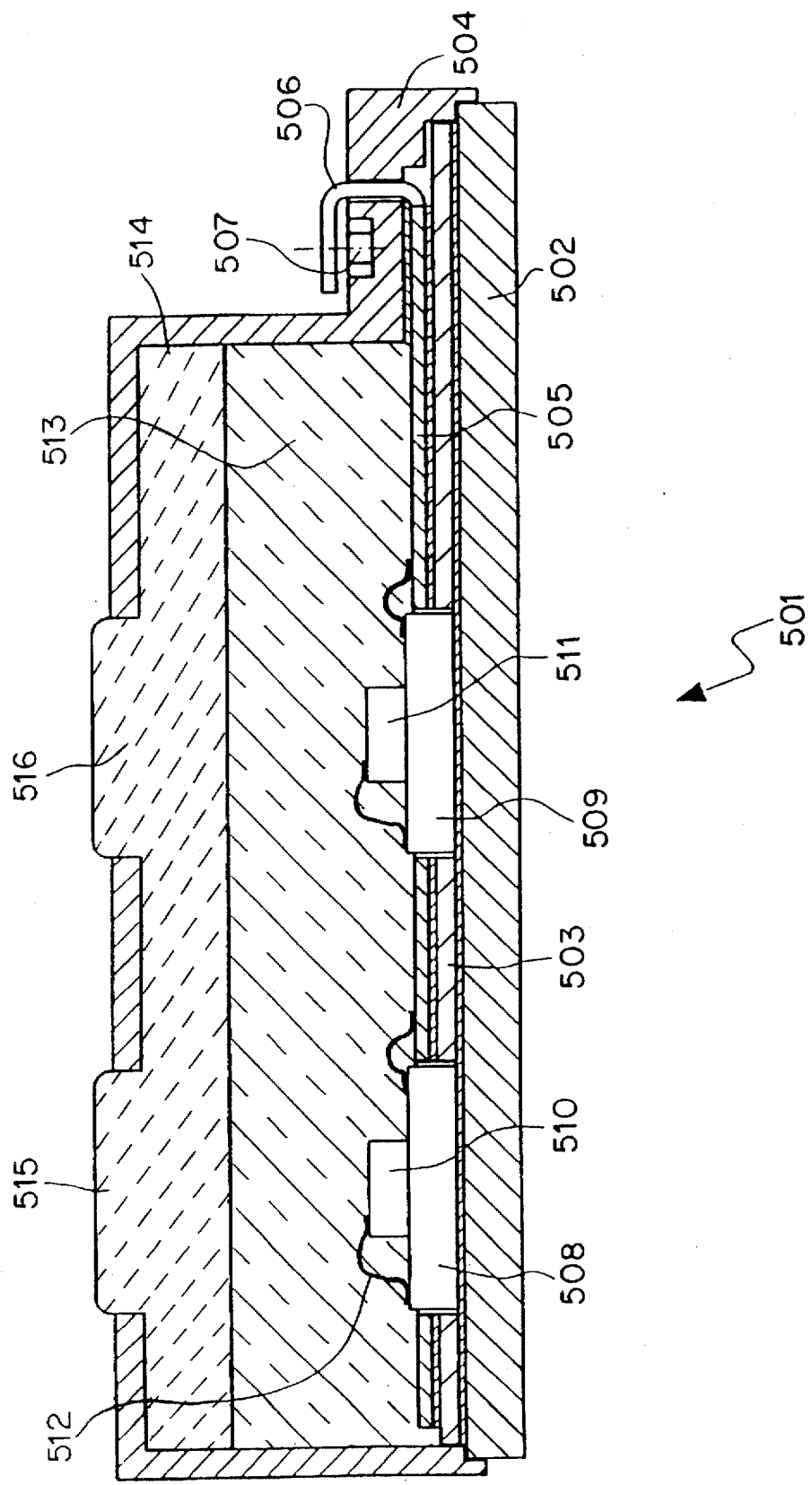
FIG. 5 shows a structure, comparable to FIGS. 3 and 4, of a module according to a fourth preferred exemplary embodiment of the invention with elastically closed-off windows for the expansion of the potting compound.

FIG. 5 represents a structure, comparable to FIGS. 3 and 4, of a module according to a fourth preferred exemplary embodiment of the invention. In the case of this power semiconductor module 501, too, the baseplate 502, the housing 504, the submodules having ceramic substrates 508, 509 and semiconductor chips 510, 511, a connection structure with connection laminates 505, insulating layers 503, bonding wires 512, connecting lugs 506 and nuts 507 are provided in the manner already described. In the case of this exemplary embodiment, which is suitable, for example, for voltages of 2500 V, openings or windows 515, 516 are arranged in the top part of the housing 504 above the submodules or semiconductor chips 510, 511. The housing is partially filled with the gel of the potting compound 513. The windows 515, 516 are closed off by an elastic potting compound 514 in the form of silicone rubber. The silicone potting has enough elasticity to avoid a build-up of pressure in the gel (potting compound 513). The elastic buffers are arranged directly above the zones of heating or potential evaporation (submodules), with the result that they are particularly effective. These region [sic] can additionally tear open in the event of extreme disturbances, in order to ensure the necessary pressure relief in the gel. Heavy housing parts are prevented from being hurled away in all cases.

Such a power semiconductor module 601 provided with windows is illustrated in FIG. 6 in a plan view (FIG. 6a), in a front view (FIG. 6b) and in a side view (FIG. 6c). Connecting lugs 603, 604, 605, 611 and 612, implemented in a threefold manner in each case, are arranged on the top side of the housing 602, in the edge region (FIG. 6a). That [sic] rectangular housing 602 has at its corners fastening holes 606 for fixedly screwing the module to a support (heat sink, etc.). Provided between the connecting lugs 603–605, 611, 612 are further connections 607–610 for the connection of a fitted-on gate or drive unit. Arranged between these connections are a plurality of windows 613–616, which correspond in terms of their function and position to the windows 515 and 516 in FIG. 5.

Figure 1:
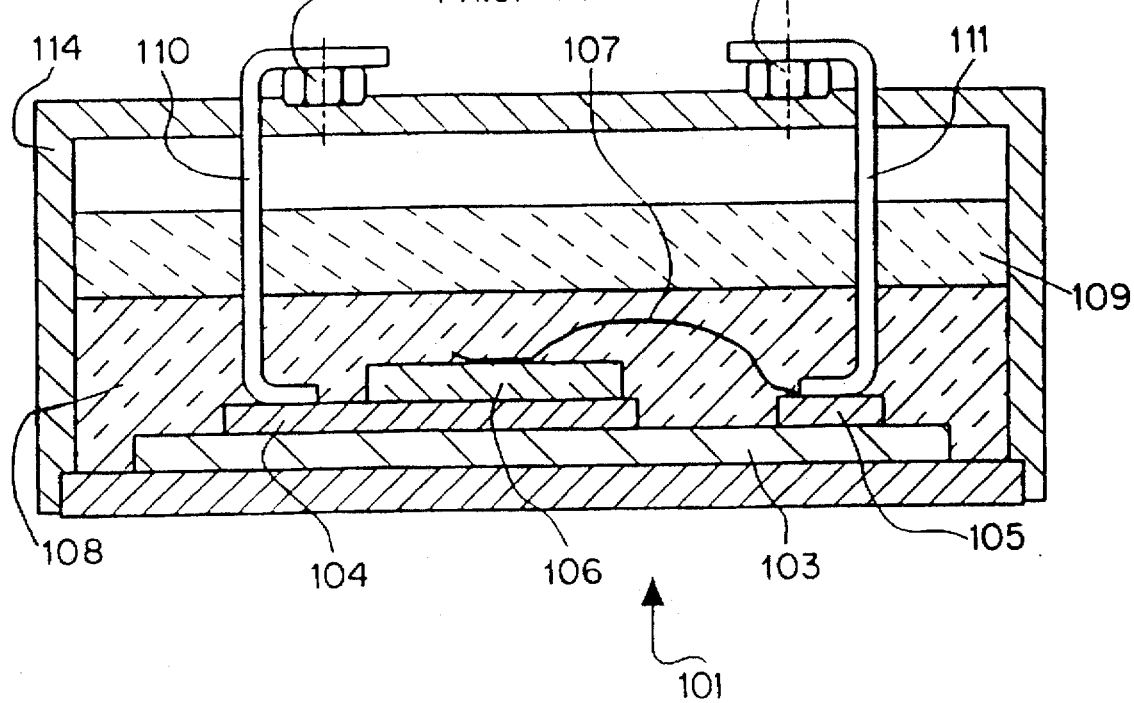
FIG. 1 shows a section of a module structure according to the prior art.
Figure 7:
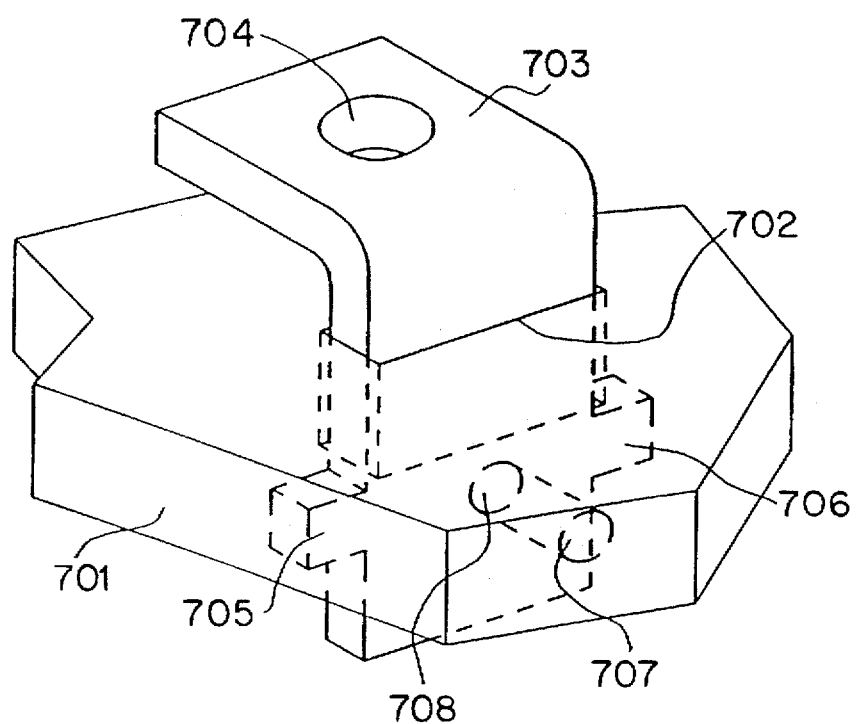
FIG. 7 shows, in a perspective view of a detail, preferred exemplary embodiments for different ways of securing the connecting lugs of a module according to the invention against being pulled vertically out of the housing.

An alternative solution, which is based on a module configuration according to FIG. 1, is represented in a view of a detail in FIG. 7. In this case—as in FIG. 1—the connecting lugs 703 are arranged vertically (in this case, it is also possible to see the through-passage hole 704 in the lug, which hole is also present in all of the other lugs described hitherto and corresponds to the nuts 112, 113, 307, 407 and 507 in FIGS. 1 and 3–5). The housing 701 has the shape of a hood like the housing 114 and contains inner cavities. The layer of cured epoxy resin (109 in FIG. 1) is absent. In order to secure the vertical position of the connecting lugs 703, the connecting lugs 703 are equipped with laterally integrally formed tabs 705, 706 or laterally projecting shoulders, which butt against the housing cover when the housing 701 having the through-passage openings 702 is fitted on.

The bending over is performed in such a way that no downwardly acting force is produced which might push the connecting lugs 704 [sic] down into the housing 701. After the bending-over operation, the vertical position of the connecting lugs 703 is secured in both directions, up and down. The housing cover is constructed such that it also has a sufficient mechanical strength for this purpose. It goes without saying that the measures which have been explained in association with FIGS. 3–6 for avoiding or attenuating an explosive expansion of the potting gel, that is to say the cavities, desired breaking points and elastically closed-off windows, can advantageously be applied in this case, too.

LIST OF REFERENCE SYMBOLS

| | | |
|---|---|---|
| 101 | | Power semiconductor module |
| 102 | | Baseplate (for example Cu) |
| 103 | | Ceramic substrate |
| 104, 105 | | Conductor track |
| 106 | | Semiconductor chip |
| 107 | | Bonding wire |
| 108 | | Silicone gel |
| 109 | | Epoxy resin |
| 110, 111 | | Connecting lug |
| 112, 113 | | Nut |
| 114 | | Housing |
| 201 | | Power semiconductor module |
| 202 | | Baseplate (for example Cu) |
| 203 | | Insulating layer |
| 204 | | Housing |
| 205 | | Connecting lug |
| 206 | | Connection laminate |
| 207, 208 | | Adhesive layer |
| 209 | | Potting compound (gel) |
| 210 | | Through-passage opening |
| 211 | | Nut |
| 301, 401, | 501 | Power semiconductor module |
| 302, 402, | 502 | Baseplate |
| 303, 403, | 503 | Insulating layer |
| 304, 404, | 504 | Housing |
| 305, 405, | 505 | Connection laminate |
| 306, 406, | 506 | Connecting lug |
| 307, 407, | 507 | Nut |
| 308, 309 | ) | |
| 408, 409 | } | Ceramic substrate |
| 508, 509 | ) | |
| 310, 311 | ) | |
| 410, 411 | } | Semiconductor chip |
| 510, 511 | ) | |

| | | |
|---|---|---|
| 312, 412, | 512 | Bonding wire |
| 313, 413, | 513 | Potting compound (gel) |
| 414, 415 | | Desired breaking point |
| 416 | | Drive unit |
| 514 | | Potting compound (silicone rubber) |
| 515, 516 | | Window |
| 601 | | Power semiconductor module |
| 602 | | Housing |
| 603, 604, | 605 | Connecting lug |
| 606 | | Fastening hole |
| 607–610 | | Connection (gate unit) |
| 611, 612 | | Connecting lug |
| 613–616 | | Window |
| 701 | | Housing |
| 702 | | Through-passage opening |
| 703 | | Connecting lug |
| 704 | | Through-passage hole |
| 705, 706 | | Tab |
| 707 | | Pin |
| 708 | | Hole |

I claim:

1. A power semiconductor module comprising at least one semiconductor chip which is arranged on a baseplate and is surrounded by a housing arranged above the baseplate, characterized in that the power semiconductor module is designed for relief of an excess pressure which has formed in the region of the at least one semiconductor chip, and further characterized in that the at least one semiconductor chip is externally connected by connecting lugs which are electrically connected to the at least one semiconductor chip and are routed to the outside through corresponding through-passage openings in the housing, and further characterized in that the connecting lugs are constructed as parts of connection laminates which are arranged inside the housing and parallel to the baseplate and are mechanically connected to the latter over a large area.

2. The power semiconductor module according to claim 1, characterized in that the connection laminates and the baseplate are bonded together with insulating layers lying therebetween to form a layer composite.

3. The power semiconductor module according to claim 2, characterized in that the connecting lugs are bent upward at the sides of the housing and are routed vertically out of the housing, and in that before the connecting lugs are bent, the housing is placed on the associated connection laminate and supports the connection laminate against vertically acting tensile forces.

4. The power semiconductor module according to claim 1, characterized in that the connection lugs are bent upward at the sides of the housing and are routed vertically out of the housing, and in that before the connecting lugs are bent, the housing is placed on the associated connection laminate and supports the connection laminate against vertically acting tensile forces.

5. The power semiconductor module according to claim 4, characterized in that the housing rests directly on the respective connection laminate.

6. The power semiconductor module according to claim 4, characterized in that, in order to accommodate manufacturing tolerances, the housing is placed on the respective connection laminate only to the extent that a gap remains free between the housing and the respective connection laminate, and the gap is filled with a potting compound.

7. The power semiconductor according to claim 1, characterized in that, starting from the baseplate, the housing is filled at least partially with an insulating potting compound, and in that means are provided for preventing or rendering innocuous an explosive expansion of the potting compound.

8. The power semiconductor module according to claim 7, characterized in that the means for preventing or rendering innocuous an explosive expansion of the potting compound comprises cavities which are arranged within the housing and into which the potting compound can expand unimpeded.

9. The power semiconductor module according to claim 8, characterized in that the cavities are respectively arranged above the semiconductor chips.

10. The power semiconductor module according to claim 7, characterized in that the means for preventing or rendering innocuous an explosive expansion of the potting compound comprises desired breaking points which are arranged in the housing, rupture in the event of a disturbance or short circuit and enable the potting compound to emerge in an unimpeded manner.

11. The power semiconductor module according to claim 10, characterized in that the desired breaking points are respectively arranged above the semiconductor chips.

12. The power semiconductor module according to one of claim 10, characterized in that a trapping means is arranged above the housing for intercepting housing parts which are hurled away during the rupture of the desired breaking points.

13. The power semiconductor module according to claim 12, characterized in that the trapping means comprises a drive unit which is fastened on the housing.

14. The power semiconductor module according to claim 7, characterized in that the means for preventing or rendering innocuous an explosive expansion of the potting compound comprises windows which are arranged in the housing and are closed off by an elastic potting compound.

15. The power semiconductor module according to claim 14, characterized in that the windows are respectively arranged above the semiconductor chips.

16. The power semiconductor module according to claim 1, characterized in that the housing is filled at least partially with an insulating potting compound, and in that means are provided for preventing or rendering innocuous an explosive expansion of the potting compound.

17. A power semiconductor module comprising at least one semiconductor chip which is arranged on a baseplate and is surrounded by a housing arranged above the baseplate, characterized in that the power semiconductor module is designed for relief of an excess pressure which has formed in the region of the at least one semiconductor chip, and further characterized in that the at least one semiconductor chip is externally connected by means of connecting lugs which are electrically connected to the at least one semiconductor chip and are routed to the outside through corresponding through-passage openings in the housing, and in that means are provided on the connecting lugs for securing the connecting lugs against being pulled out of the housing.

18. The power semiconductor module according to claim 17, characterized in that the securing means on the connecting lugs comprises laterally integrally formed tabs or laterally projecting shoulders and supports the connecting lugs on the inside of the housing.

19. The power semiconductor module according to claim 17, characterized in that the securing means comprises at least one pin which is inserted transversely through a through-passage hole in the connecting lugs in order to support the connecting lugs on the inside of the housing.

20. The power semiconductor module according to claim 2, characterized in that the housing is filled at least partially with an insulating potting compound, and in that means are provided for preventing or rendering innocuous an explosive expansion of the potting compound.

\* \* \* \* \*